United States Patent
Cherniak et al.

(10) Patent No.: US 11,454,715 B2
(45) Date of Patent: Sep. 27, 2022

(54) RADAR SIGNAL MODULATOR WITH BANDWIDTH COMPENSATION AND FREQUENCY OFFSET SEQUENCE

(71) Applicants: Infineon Technologies AG, Neubiberg (DE); POLITECNICO DI MILANO, Milan (IT)

(72) Inventors: Dmytro Cherniak, Villach (AT); Salvatore Levantino, Mailand (IT); Mario Mercandelli, Romano di Lombardia (IT)

(73) Assignees: Infineon Technologies AG, Neubiberg (DE); POLITECNICO DI MILANO, Milan (IT)

(*) Notice: Subject to any disclaimer, the term of this patent is extended or adjusted under 35 U.S.C. 154(b) by 373 days.

(21) Appl. No.: 16/705,690

(22) Filed: Dec. 6, 2019

(65) Prior Publication Data
US 2021/0173070 A1    Jun. 10, 2021

(51) Int. Cl.
*G01S 13/40*    (2006.01)
*G01S 7/35*    (2006.01)

(52) U.S. Cl.
CPC ............... *G01S 13/40* (2013.01); *G01S 7/35* (2013.01)

(58) Field of Classification Search
CPC .................................. G01S 13/40; G01S 7/35
See application file for complete search history.

(56) References Cited

U.S. PATENT DOCUMENTS

| | | | |
|---|---|---|---|
| 9,772,397 B1 | 9/2017 | Bordes et al. | |
| 10,135,452 B2 | 11/2018 | Cherniak et al. | |
| 10,944,410 B1* | 3/2021 | Garghetti | H03L 7/0996 |
| 11,184,013 B1* | 11/2021 | Grimaldi | H03C 3/095 |
| 11,196,382 B1* | 12/2021 | Padovan | H03B 5/1228 |
| 2005/0003785 A1* | 1/2005 | Jackson | G01S 7/35 |
| | | | 455/260 |
| 2007/0188373 A1 | 8/2007 | Shirakawa et al. | |
| 2017/0012631 A1 | 1/2017 | Dato et al. | |
| 2017/0023662 A1 | 1/2017 | Ding | |
| 2017/0219689 A1 | 8/2017 | Hung et al. | |
| 2018/0003799 A1 | 1/2018 | Yang et al. | |
| 2018/0175868 A1* | 6/2018 | Stuhlberger | H03C 3/0941 |
| 2018/0241406 A1 | 8/2018 | Cherniak et al. | |
| 2019/0013815 A1* | 1/2019 | Saric | H03L 7/095 |
| 2019/0056476 A1 | 2/2019 | Lin | |
| 2019/0094334 A1* | 3/2019 | Chang | H04B 1/713 |
| 2019/0334534 A1* | 10/2019 | Kitamura | H04B 1/30 |
| 2021/0156982 A1* | 5/2021 | Stettiner | G01S 7/356 |

* cited by examiner

*Primary Examiner* — Marcus E Windrich
(74) *Attorney, Agent, or Firm* — Eschweiler & Potashnik, LLC (57) ABSTRACT

Systems, methods, and circuitries are provided for generating a frequency hopping radar signal. In one example, a radar signal modulator include a frequency offset generator, a phase locked loop, and a bandwidth compensation circuitry. The frequency offset generator is configured to generate a sequence of frequency offsets. The bandwidth compensation circuitry is configured to combine a modulation signal and the sequence of frequency offsets to generate a bandwidth compensated signal. The PLL is configured to receive the bandwidth compensated signal and generate a frequency hopping radar signal based on the bandwidth compensated signal.

19 Claims, 9 Drawing Sheets

RADAR SIGNAL MODULATOR WITH BANDWIDTH COMPENSATION AND FREQUENCY OFFSET SEQUENCE

FIELD

The present disclosure relates to the field of radar circuits and in particular to methods, systems, and circuitry for generating radar signals for detecting objects.

BACKGROUND

Radio frequency (RF) transceivers can be found in numerous applications, particularly in the field of wireless communications and radar sensors. In the automotive sector there is an increasing demand for radar sensors for use in detecting vehicles and other objects near a sensor-equipped vehicle. Frequency-modulated continuous wave (FMCW) radar systems use radar signals whose frequency is modulated by altering the signal frequency up and down in some predetermined manner. One type of such radar signals are referred to as "chirp signals" or simply as chirps, wherein the frequency of the transmitted signal is ramped up in an up-chirp and ramped down in a down-chirp.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
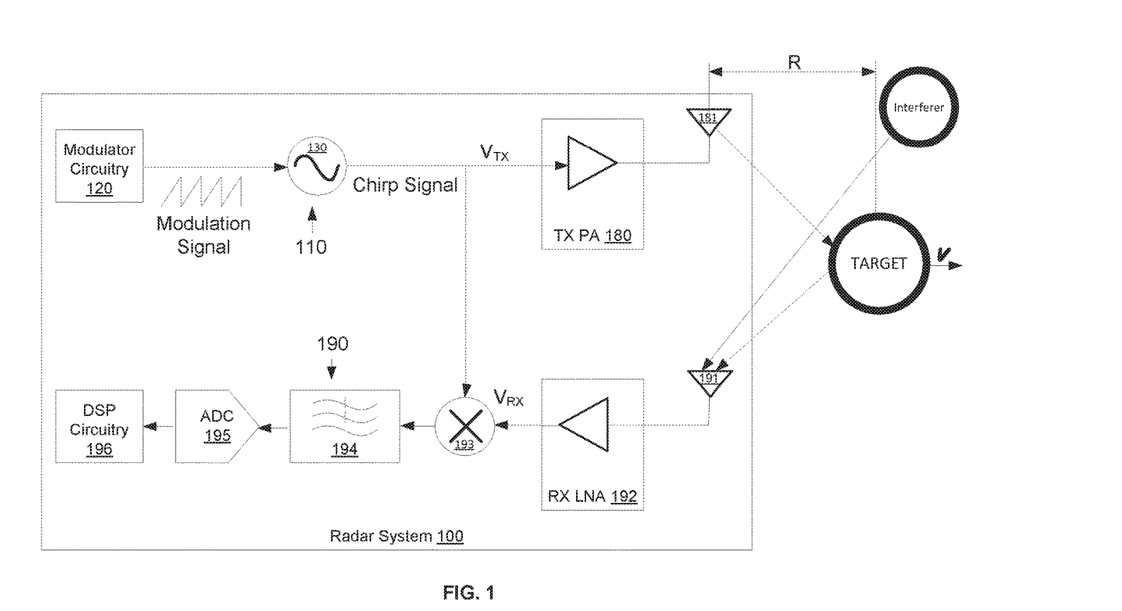
FIG. 1 illustrates an example FMCW radar system sensing a target object as well as an interferer object.

FIG. 1 illustrates a FMCW radar system 100 detecting a target object traveling at velocity v. The system 100 includes a transmit chain 110 with modulator circuitry 120 that controls oscillator circuitry 130 to generate a chirp signal at an operating frequency of the system. The chirp signal is amplified by a power amplifier (PA) 180 and broadcast by an antenna 181. A receive chain 190 includes an antenna 191 that receives a signal that includes echoes (reflections of the transmitted chirp signal). The received signal is amplified by a low noise amplifier (LNA) 192 and combined by mixer 193 with the chirp signal. The mixing process generates a signal having a phase equal to a difference in phase between the transmit and receive signals (called the beat frequency signal). A low-pass filter 194 filters the beat frequency signal, which is then converted to a digital signal by analog-to-digital converter (ADC) 195. This digital signal is processed by digital signal processing (DSP) circuitry 196 to determine a distance between the system 100 and surrounding objects.

Figure 1A:
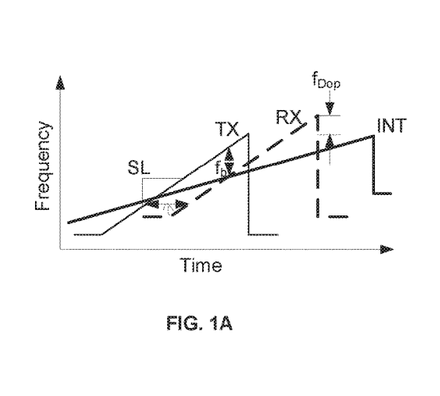
FIG. 1A is a plot illustrating the frequency and time relationship between the transmitted signal and the received signal in an FMCW radar system.

FIG. 1A illustrates an example of a transmitted chirp (solid line), a received chirp (dashed line), and an interfering signal INT (heavy line). The slope SL of the ramp is known and the difference in frequency between the transmitted and received signals, the beat frequency $f_b$, is calculated by DSP 196 based on the measured phase difference between the signals. The beat frequency and SL are used to deduce the time delay $\tau$ between the transmitted chirp and the received chirp. This time delay provides an indication of the distance between the system 100 and an object that reflected back an echo signal. The beat frequency includes a Doppler component $f_{Dop}$ that can be analyzed across multiple chirps to determine a relative velocity between the system 100 and an object.

Figure 1B:
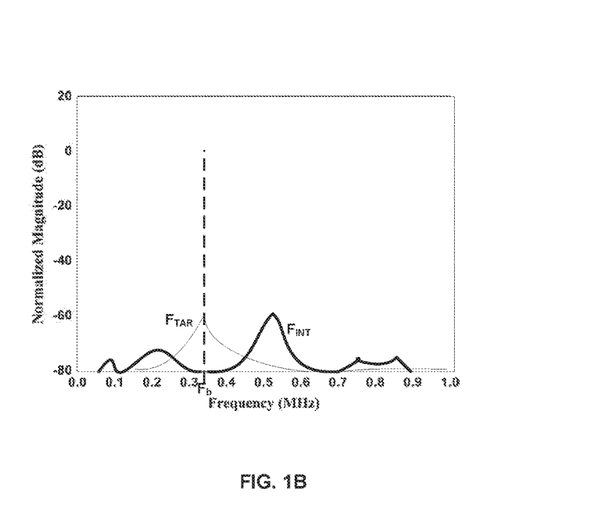
FIG. 1B is a plot illustrating a frequency spectrum of a beat frequency that includes a contribution from a target object and contribution from an interferer object.

FIG. 1B illustrates an example of a beat frequency spectrum that is analyzed by DSP 196 to detect target objects. Frequencies having a relatively high amplitude are identified as being indicative of an object. The contribution of the echo from the target object results in a first peak in the spectrum at $F_{TAR}$ while the contribution of the interferer results in a second peak at $F_{INT}$. It can be seen that ghost targets can cause inaccuracies in the detection of target objects by the system 100.

The number of vehicles with FMCW radar systems is continuously increasing, which results in an increased probability of interference amongst vehicles. Several approaches to mitigating the effects of interferers in FMCW radar systems are in use. However, many of the mitigation techniques involve complicated signal generators and/or software-based modifications to the chirp. These solutions are inherently slow and can involve expensive processing components.

Described herein are methods, systems, and circuitries that generate a frequency hopping radar signal that changes frequency. The described methods, systems, and circuitries generate this signal using bandwidth compensation circuitry that generates a bandwidth compensated signal that is input to a phase locked loop (PLL) without the need for complicated waveform generators or software, thereby providing effective interference mitigation with minimal expense.

Figure 2:
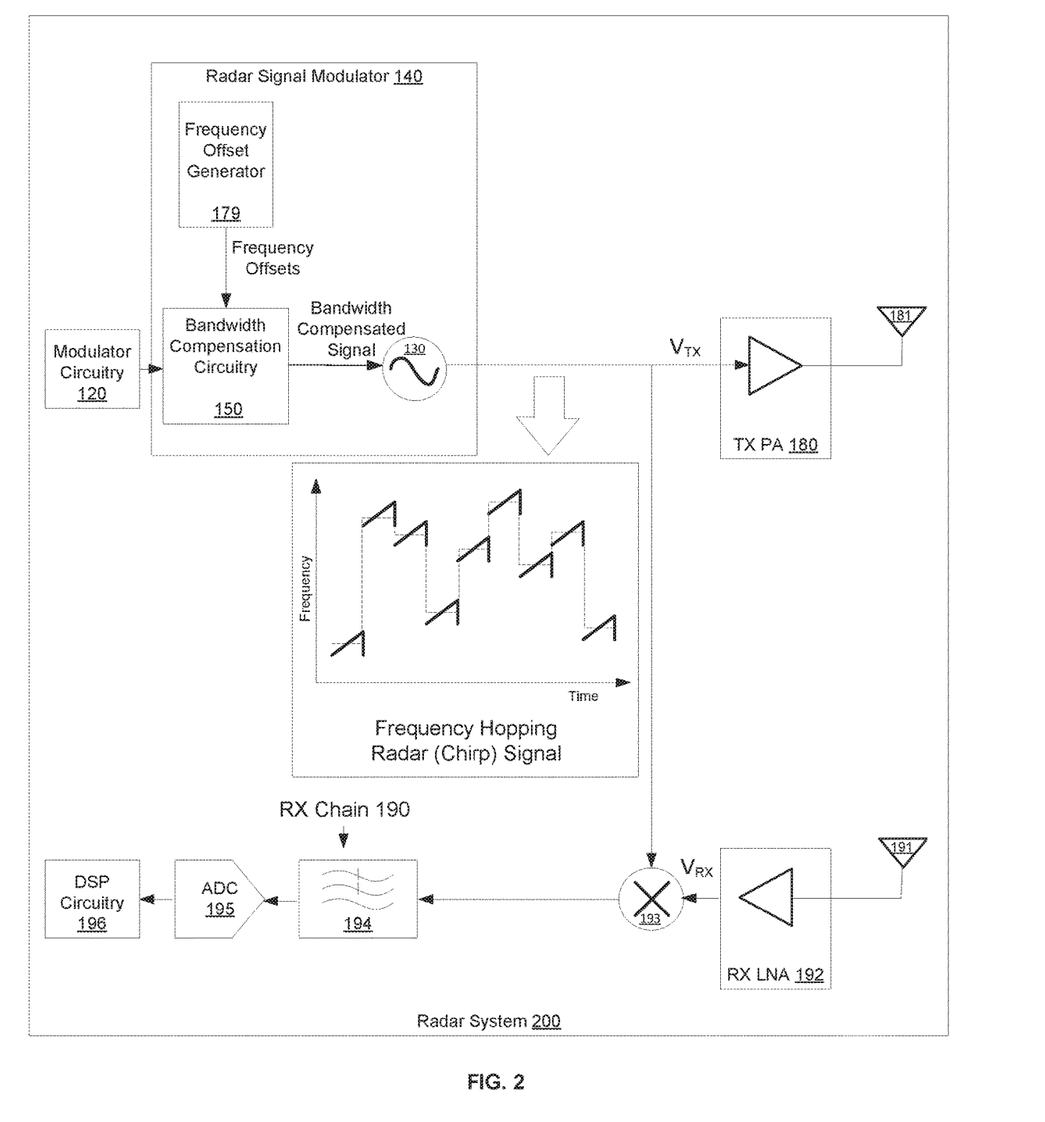
FIG. 2 illustrates one example radar signal modulator in accordance with various aspects described.

FIG. 2 illustrates an example radar system 200 that utilizes a frequency hopping radar signal to detect objects. Many examples in this description will describe the frequency hopping radar signal as a "chirp" signal. However, it is to be understood that the frequency of other FMCW signals (e.g., triangle, square-wave, stepped, sinusoidal, or any other FMCW signals) may also be changed by the described methods, systems, and circuitries for interference mitigation. Further, the described methods, systems, and circuitries may also be used with phase-modulated radar signals.

The radar system 200 includes many of the same or similar components as the radar system 100 including the receive chain 180 as well as the transmit power amplifier 180 and the antenna 181. The function of these components will not be repeated here for the sake of brevity. As in system 100, the modulator circuitry 120 generates a modulation signal which, in the illustrated example, is a saw tooth signal. The modulation signal is provided to a radar signal modulator 140 that includes bandwidth compensation circuitry 150, the PLL 130, and a frequency offset generator 179. The frequency offset generator 179 generates a sequence of offset values and transmits them to or stores them for access by the bandwidth compensation circuitry 150. The frequency offset generator 179 may be any suitable set of hardware components and/or software algorithm that generates a sequence of offset values. The frequency offset generator 179 may generate a sequence of random offset values. In some examples, the frequency offset generator may generate a sequence of offset values that encodes frequency shift keying (FSK) or phase shift keying (PSK) information to be exchanged with other radar receivers.

The bandwidth compensation circuitry 150 combines the modulation signal with the sequence of frequency offsets to generate a version of the modulation signal having an increased bandwidth (hereinafter a "bandwidth compensated signal"). The bandwidth compensated signal may be characterized as an adapted modulation signal that, in combination with the PLL transfer function, forms an all-pass transfer function from the modulation signal input to the output of the PLL. In one example, the bandwidth compensated signal has a bandwidth that is greater than the bandwidth of the PLL 130. This use of the bandwidth compensated signal overcomes the chirp speed limitations caused by the narrow bandwidth of the PLL.

Figure 3:
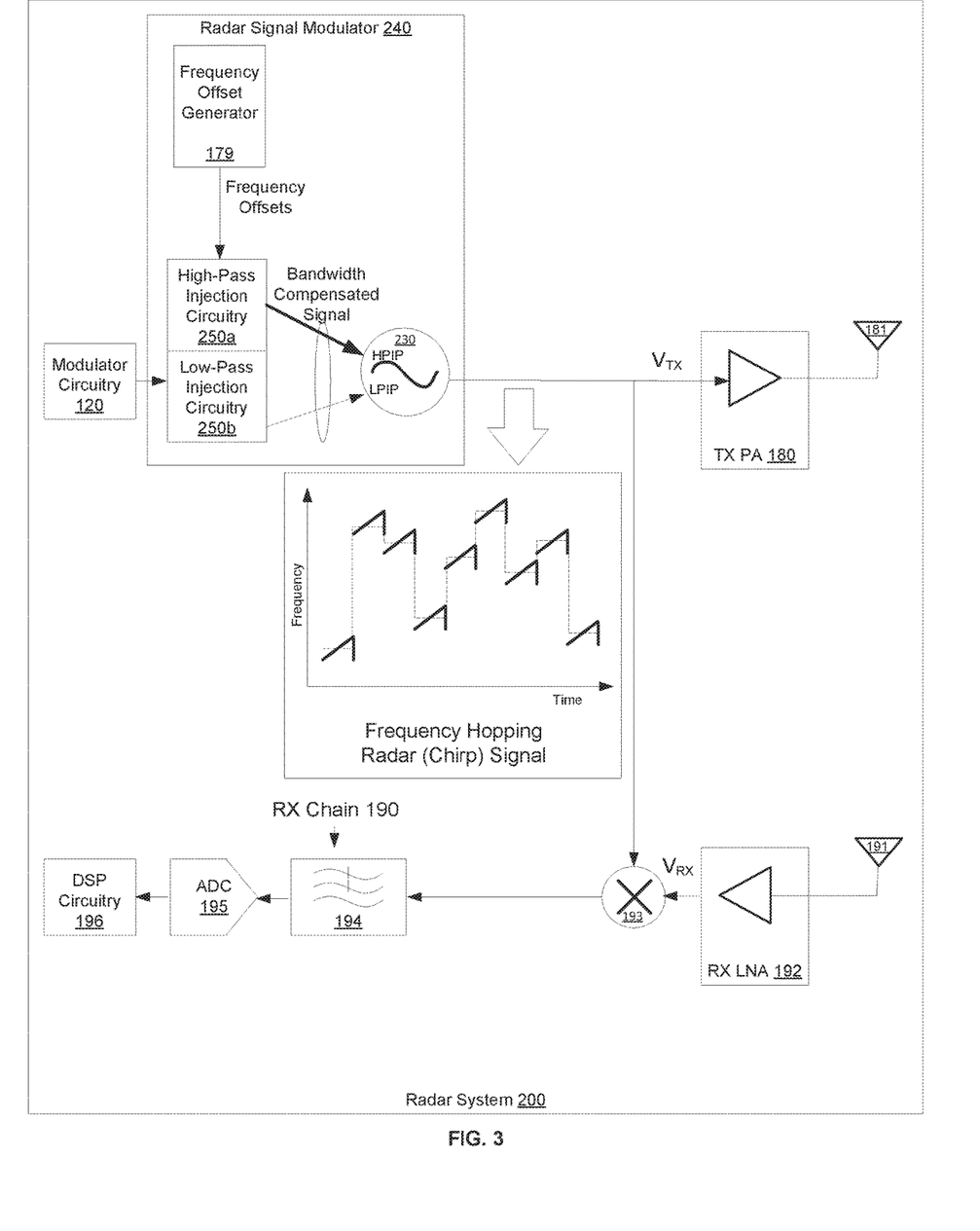
FIG. 3 illustrates one example embodiment of the radar signal modulator of FIG. 2 in accordance with various aspects described.
Figure 3A:
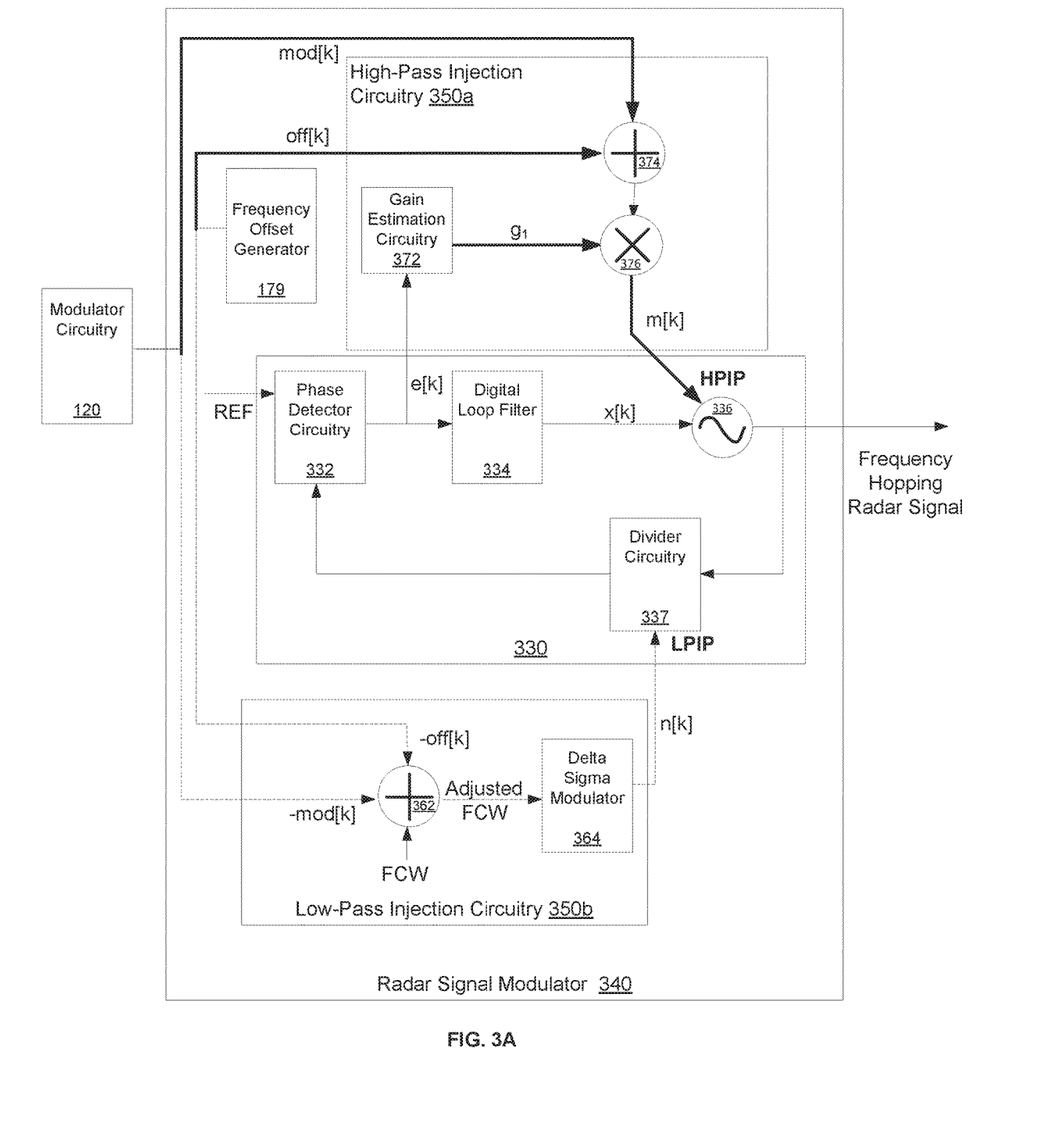
FIG. 3A illustrates another example embodiment of the radar signal modulator of FIG. 3 in accordance with various aspects described.
Figure 3B:
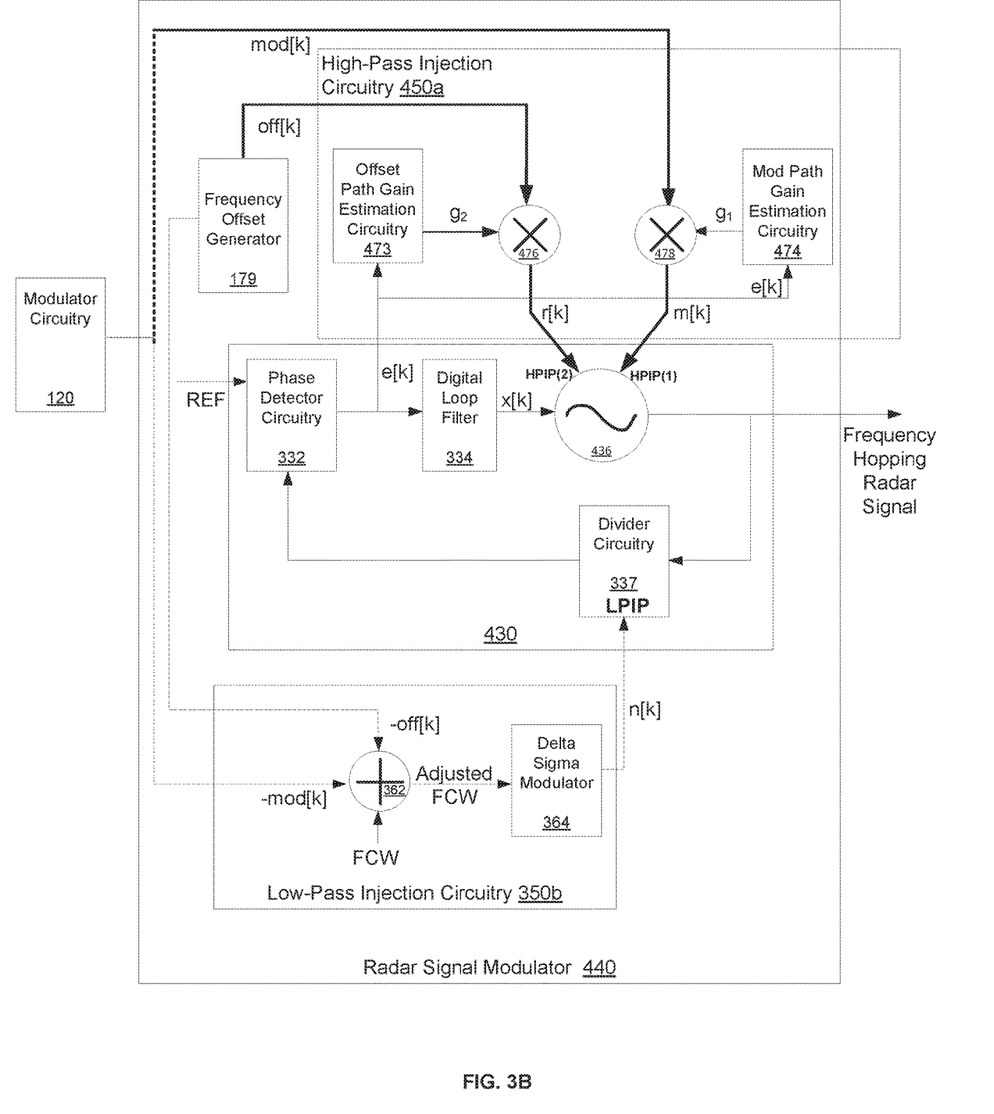
FIG. 3B illustrates another example embodiment of the radar signal modulator of FIG. 3 in accordance with various aspects described.
Figure 3C:
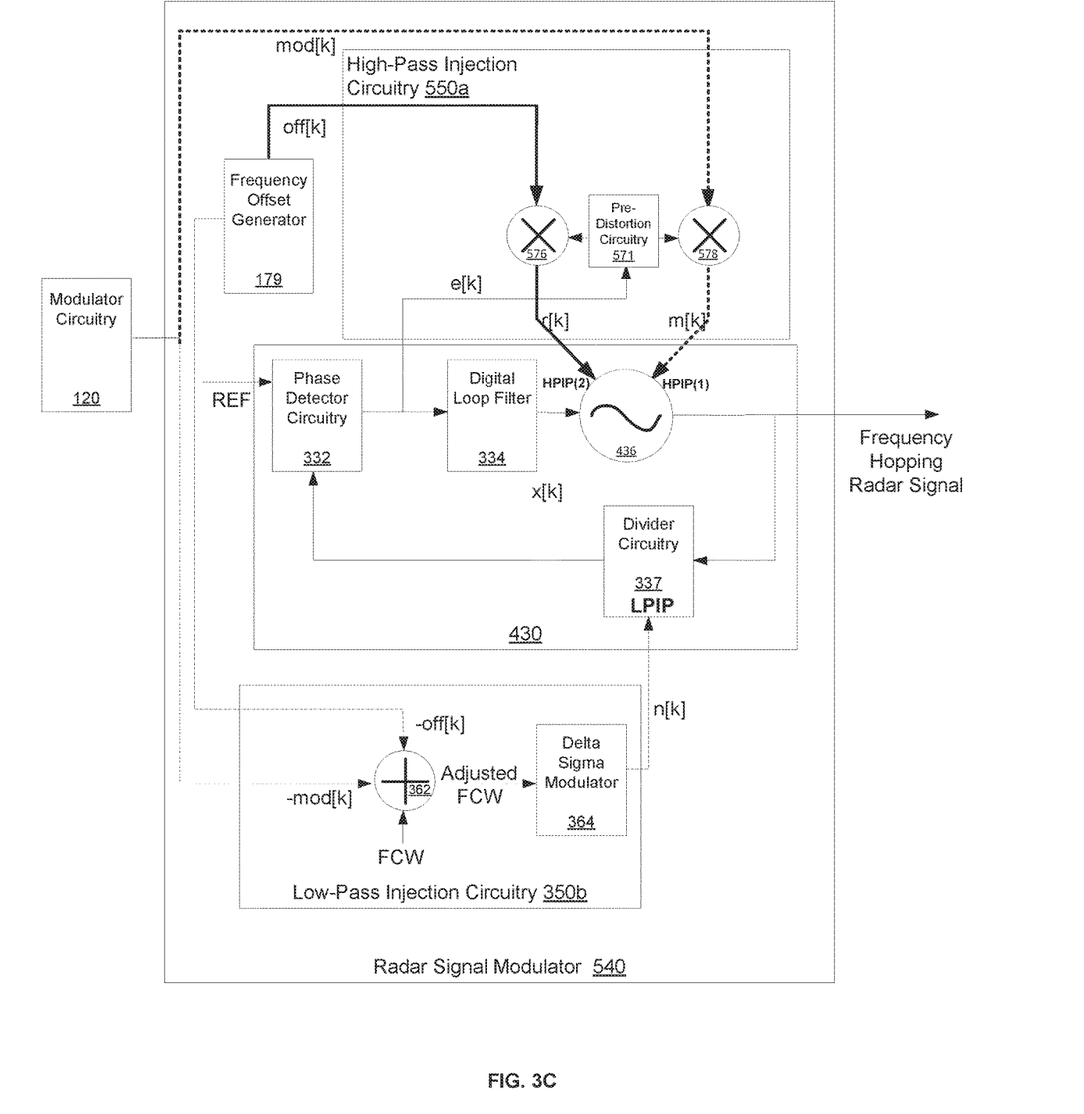
FIG. 3C illustrates another example embodiment of the radar signal modulator of FIG. 3 in accordance with various aspects described.

In one example illustrated in FIGS. 3-3C, the bandwidth compensation circuitry is embodied as high-pass injection circuitry and low-pass injection circuitry configured to generate a bandwidth compensated signal in the form of a low-pass injection signal and a high-pass injection signal for the PLL 130. In another example illustrated in FIGS. 4-4A, the bandwidth compensation circuitry includes a pre-emphasis filter that acts on the frequency hopping modulation signal to generate a bandwidth compensated signal that is injected into the PLL 130 to compensate for the low-pass transfer function of the PLL.

FIG. 3 illustrates a radar system 200 in which the bandwidth compensation circuitry is embodied as high-pass injection circuitry 250a and low-pass injection circuitry 250b. A radar signal modulator 240 includes a PLL 230, the frequency offset generator 179, and the high-pass injection circuitry 250a and the low-pass injection circuitry 250b. In one example, the high-pass injection circuitry 250a, the low-pass injection circuitry 250b and the PLL 130 are integrated in a same semiconductor chip. The high-pass injection circuitry 250a generates a high-pass injection signal (in bold) and the low-pass injection circuitry 250b generates a low-pass injection signal (in dashed line). The high-pass injection signal is injected into the PLL 230 at a high-pass injection point (HPIP). The low-pass injection signal is injected into the PLL 230 at a low-pass injection point (LPIP). This pair of signals corresponds, functionally, to the bandwidth compensated signal of FIG. 2 that compensates for the narrow bandwidth of the PLL 230.

FIG. 3A illustrates one example of a radar signal modulator 340 of the radar system 200 of FIG. 2. A digital PLL 330 includes a digitally controlled oscillator (DCO) 336, a digital loop filter 334, a phase detector 332, and a divider circuitry 337. The phase detector 332, which may be a time-to-digital converter (TDC) in some examples, receives a (divided) feedback signal from the DCO and a reference signal having some predetermined (e.g., clock) frequency. The phase detector converts the delay between the reference signal and the feedback signal into a digital error signal e[k]. The error signal is the difference between the reference signal including phase and frequency and the (divided) feedback signal. The digital loop filter 334 filters noise in the error signal e[k]. In some examples the digital loop filter 334 may include both highpass and low-pass filter functions.

The divider circuitry 337, which may be a multi-modulus divider (MMD) in some examples, divides the signal generated by the DCO 336 by any of a plurality of divisors, one of which is selected by the low-pass injection signal n[k]. The divider circuitry 337, which can be characterized as the LPIP for the PLL, performs a frequency divider function on the signal output by the DCO to reduce the signal's frequency to the range of the frequency of the reference signal. A reference signal having a lower frequency than the DCO output signal may be used to compensate for the frequency capabilities of the phase detector circuitry 332. The divider circuitry 337 receives the selected divisor n in the form of a frequency command word (FCW) that specifies n[k]. The DCO 336 includes tuning circuitry (not shown), such as capacitor banks, that adjust the frequency of the signal generated by the DCO. The tuning circuitry, which can be characterized as the HPIP for the PLL, is controlled by a tuning signal m[k]. It can be seen that manipulating the divisor n[k] or the tuning signal m[k] will change the output signal of the DCO.

The radar signal modulator 340 utilizes two-point injection to the PLL 330 to generate the frequency hopping radar signal. In this two-point injection scheme, the divisor n[k] corresponds to a low-pass injection signal and the tuning signal m[k] corresponds to a high-pass injection signal. Recall that the low-pass injection signal and the high-pass injection signal together correspond to the bandwidth compensated signal of FIG. 2. On a low-pass path (shown in dashed line) a low-pass injection circuitry 350b generates the low-pass injection signal n[k] based on the modulation signal mod[k] and the sequence of frequency offsets off[k] (which may be either random or may encode FSK or PSK information). The low-pass injection circuitry 350b includes combination circuitry 362 that adjusts the FCW by combining it with a "negative" modulation signal −mod[k] and a negative frequency offset −off[k]. In other examples, the FCW may be adjusted by combining it with a positive modulation signal mod[k] and/or a positive frequency offset off[k]. A delta-sigma modulator 364 receives the adjusted frequency command word output by the combination circuitry 362 to incrementally adjust the values of the sequence of n[k] signals between integers to achieve fractional division by the divider circuitry 337 when desired.

In the high-pass path (shown in bold), a high-pass injection circuitry 350a includes combination circuitry 374 that combines the modulation signal mod[k] with the sequence of frequency offsets off[k] to generate a frequency hopping modulation signal. The high-pass injection circuitry 350a includes gain circuitry comprising gain estimation circuitry 372 and a multiplier (e.g., mixer) 376. The gain estimation circuitry 372 determines (e.g., using a least mean square (LMS) algorithm) a mismatch between the transfer function of the high-pass path and the transfer function of the low-pass path based on a sensed error signal e[k] and calculates a gain $g_1$ that, when applied to the modulation signal, will compensate for the mismatch. In one example, the gain estimation circuitry is configured to determine a gain $g_1$ for the at least one high-pass injection signal that minimizes a correlation between a sensed phase error e[k] of the phase locked loop (determined by the phase detector circuitry 332) and the modulation signal. The multiplier (e.g., mixer) 376 scales the modulation signal by the gain $g_1$ using the multiplier (e.g., mixer) 376 and the resulting scaled signal is provided as the high-pass injection signal to tuning circuitry of the DCO 336. In this manner, the radar signal modulator 340 generates a frequency hopping radar signal.

In the example illustrated in FIG. 3A the combination circuitry 362 of the low-pass injection circuitry combines the mod[k] signal and the off[k] signal having a first polarity (e.g., "negative") while the combination circuitry 374 of the high-pass injection circuitry combines the respective mod[k] signal and the off[k] signal having an opposite polarity (e.g., "positive"). In other words, in the example of FIG. 3A a polarity of at least one of the modulation signal mod[k] or the sequence of frequency offsets off[k] input to the combination circuitry 362 is reversed with respect to the respective modulation signal mod[k] or the sequence of frequency offsets off[k] input to the combination circuitry 374.

FIG. 3B illustrates another example of a radar signal modulator 440 of the radar system 200 of FIG. 2. The radar signal modulator 440 includes the low-pass injection circuitry 350b of FIG. 3A to generate the low-pass injection signal. The radar signal modulator 440 includes a PLL 430 that includes the same or similar components as PLL 330 of FIG. 3A, except that a DCO 436 of the PLL 430 has tuning circuitry that includes capacitor banks which can be controlled separately.

The radar signal modulator 440 includes high-pass injection circuitry 450a that generates the high-pass injection signal by generating separate high-pass injection signals for first and second capacitor banks of the DCO 430. Thus, the two different capacitor banks can be characterized as first and second HPIPs for the PLL. A first high-pass injection signal m[k] is generated based on the modulation signal and a second high-pass injection signal r[k] is generated based on the sequence of frequency offsets.

The high-pass injection circuitry 450a includes a modulation path gain estimation circuitry 474 that determines a mismatch between the transfer function of the high-pass path for the modulation signal and the transfer function of the low-pass path based on a sensed phase error e[k] of the PLL (output by phase detector circuitry 332). The gain estimation circuitry 474 calculates a gain $g_1$ that, when applied to the modulation signal, will compensate for the mismatch. In one example, the modulation path gain estimation circuitry 474 is configured to determine a gain for the modulation signal that minimizes a correlation between the sensed phase error signal e[k] of the PLL and the modulation signal. The modulation signal is scaled with the gain $g_1$ by multiplier (e.g., mixer) 478 and provided to a first high-pass injection point (e.g., a first bank of capacitors) of the DCO 436.

The high-pass injection circuitry 450a includes an offset path gain estimation circuitry 473 that determines a mismatch between the transfer function of the high-pass path for the sequence of frequency offsets and the transfer function of the low-pass path based on a sensed error e[k] of the PLL. The offset path gain estimation circuitry 473 calculates a gain $g_2$ that, when applied to the sequence of frequency offsets, will compensate for the mismatch. In one example, the offset path gain estimation circuitry 473 is configured to determine a gain for the sequence of frequency offsets that minimizes a correlation between the sensed phase error e[k] and the sequence of frequency offsets. The frequency offset is scaled with the gain $g_2$ by a multiplier (e.g., mixer) 476 and provided to a second high-pass injection point (e.g., a second bank of capacitors) of the DCO 436. In this manner, the radar signal modulator 440 generates a frequency hopping radar signal. The split approach to the tuning circuitry utilized by high-pass injection circuitry 450a is advantageous because the granularity and linearity requirements for the capacitor bank (that are tuned by m[k]) will typically be more demanding than those of the capacitor bank (that are tuned by r[k]).

In practical design, the DCO may exhibit nonlinearity due to 1/sqrt(LC) dependency of the oscillation frequency on tuning capacitance, mismatch, and distributed inductance. FIG. 3C illustrates another example of a radar signal modulator 540 of the radar system 200 of FIG. 2. The radar signal modulator 540 addresses these DCO nonlinearity issues using predistortion applied at the high-pass injection point to linearize the DCO rather than the approach illustrated in FIGS. 3A and 3B. The radar signal modulator 540 includes the same or similar low-pass injection circuitry 350b of FIG. 3A to generate the low-pass injection signal and the same or similar PLL 430 of FIG. 3B. However, high-pass injection circuitry 550a includes predistortion circuitry 571 that determines predistortion coefficients to be applied by multipliers (e.g., mixers) 576, 578, to various frequency components of the sequence of frequency offsets off[k] and the modulation signal mod[k]. The pre-distortion circuitry 571 determines coefficients to minimize the sensed phase error signal e[k].

Figure 4:
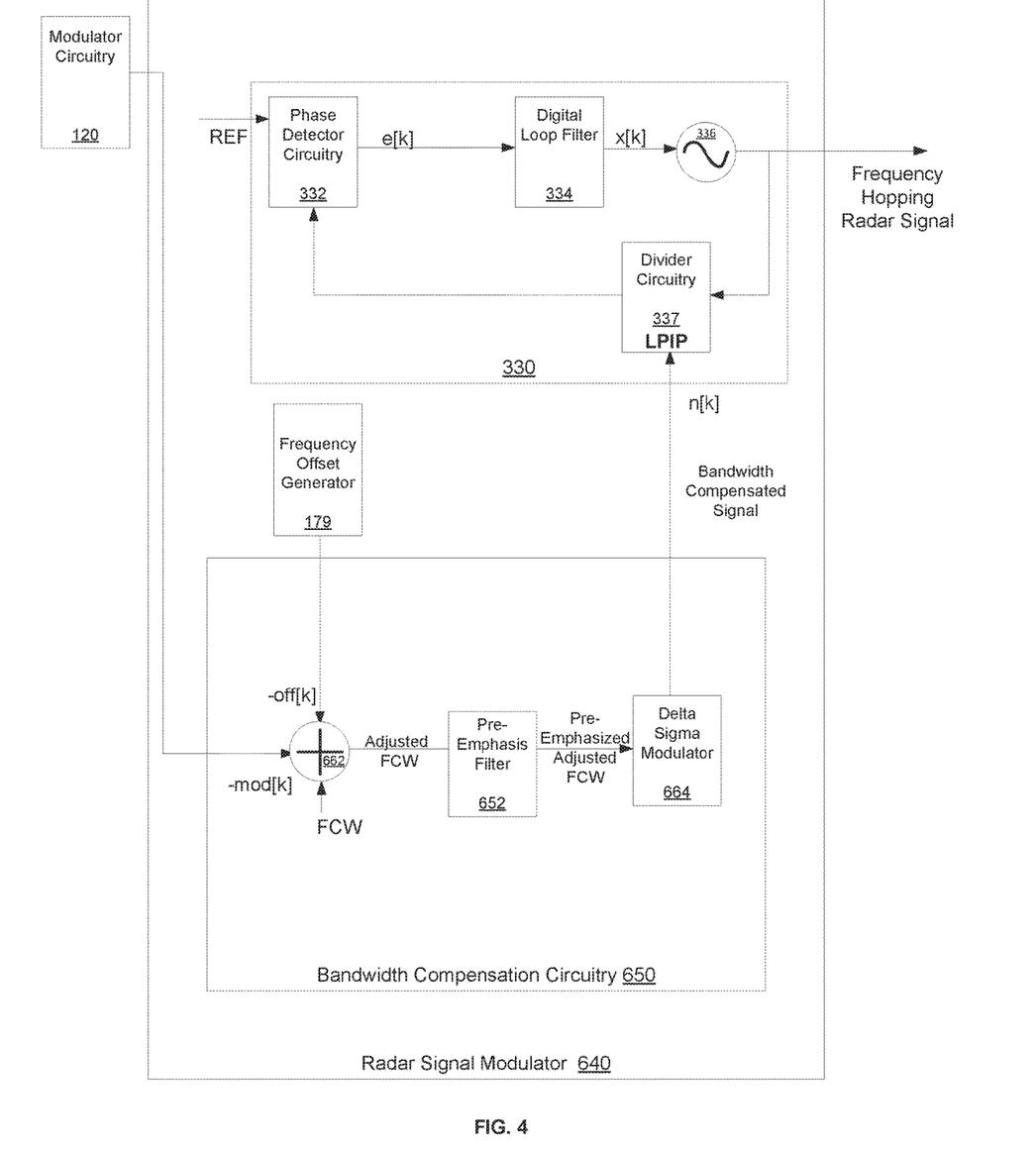
FIG. 4 illustrates one example embodiment of the radar signal modulator of FIG. 2 in accordance with various aspects described.

FIG. 4 illustrates a radar signal modulator 640 that includes many of the same components of the radar signal modulator of FIGS. 3A-3C including the PLL 330. The radar signal modulator 640 includes bandwidth compensation circuitry 650 that generates a bandwidth compensated signal that is injected to the divider 337 of the PLL 330. The bandwidth compensation circuitry 650 generates the bandwidth compensated signal n[k] based on the modulation signal mod[k] and the sequence of frequency offsets off[k] (which may be either random or may encode FSK or PSK information).

The bandwidth compensation circuitry 650 includes combination circuitry 662 that adjusts the FCW by combining it with a "negative" modulation signal –mod[k] and a negative frequency offset –off[k]. In other examples, the FCW may be adjusted by combining it with a positive modulation signal mod[k] and/or a positive frequency offset off[k]. A pre-emphasis filter 652 acts as a high-pass filter on the adjusted FCW signal to compensate for the low-pass transfer function of the PLL 330. In one example, the pre-emphasis filter 652 filters according to some pre-determined assumptions about a bandwidth of the modulation signal. The pre-emphasized adjusted FCW signal generated by the pre-emphasis filter is input to a delta-sigma modulator 664. The delta-sigma modulator 664 incrementally adjusts the values of the pre-emphasized adjusted FCW to generate a bandwidth compensated signal n[k] that includes signals between integers to achieve fractional division by the divider circuitry 337 when desired.

Figure 4A:
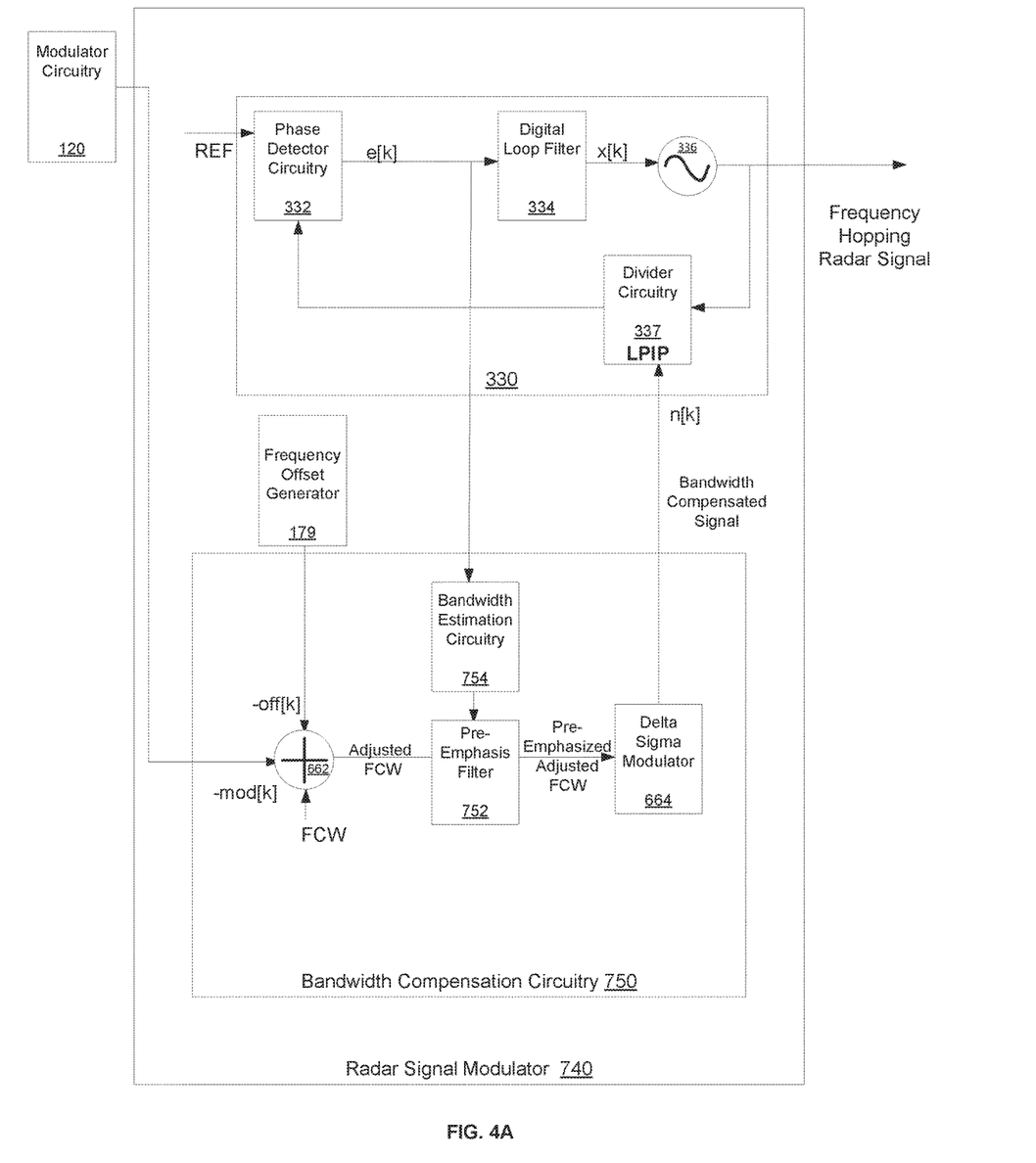
FIG. 4A illustrates another example embodiment of the radar signal modulator of FIG. 4 in accordance with various aspects described.

FIG. 4A illustrates a radar signal modulator 740 that includes many of the same components of the radar signal modulator 640 including the PLL 330 and combination circuitry 662 and delta-sigma modulator 664. The radar signal modulator 740 includes bandwidth compensation circuitry 750 that generates a bandwidth compensated signal that is injected to the divider 337 of the PLL 330. The bandwidth compensation circuitry 750 generates the bandwidth compensated signal n[k] based on the modulation signal mod[k] and the sequence of frequency offsets off[k] (which may be either random or may encode FSK or PSK information).

The bandwidth compensation circuitry 750 includes combination circuitry 662 that adjusts the FCW by combining it with a "negative" modulation signal −mod[k] and a negative frequency offset −off[k]. In other examples, the FCW may be adjusted by combining it with a positive modulation signal mod[k] and/or a positive frequency offset off[k]. Bandwidth estimation circuitry 754 estimates the bandwidth of the modulated signal based on the sensed phase error e[k] of the PLL 330. A pre-emphasis filter 752 is controlled by the bandwidth estimation circuitry 754 based on the estimated bandwidth and acts as a high-pass filter on the adjusted FCW signal to compensate for the low-pass transfer function of the PLL 330. The pre-emphasis filter 752 filters according to the bandwidth of the modulation signal as estimated by the bandwidth estimation circuitry 754. The pre-emphasized adjusted FCW signal generated by the pre-emphasis filter is input to a delta-sigma modulator 664. The delta-sigma modulator 664 incrementally adjusts the values of the pre-emphasized adjusted FCW to generate a bandwidth compensated signal n[k] that includes signals between integers to achieve fractional division by the divider circuitry 337 when desired.

Figure 5:
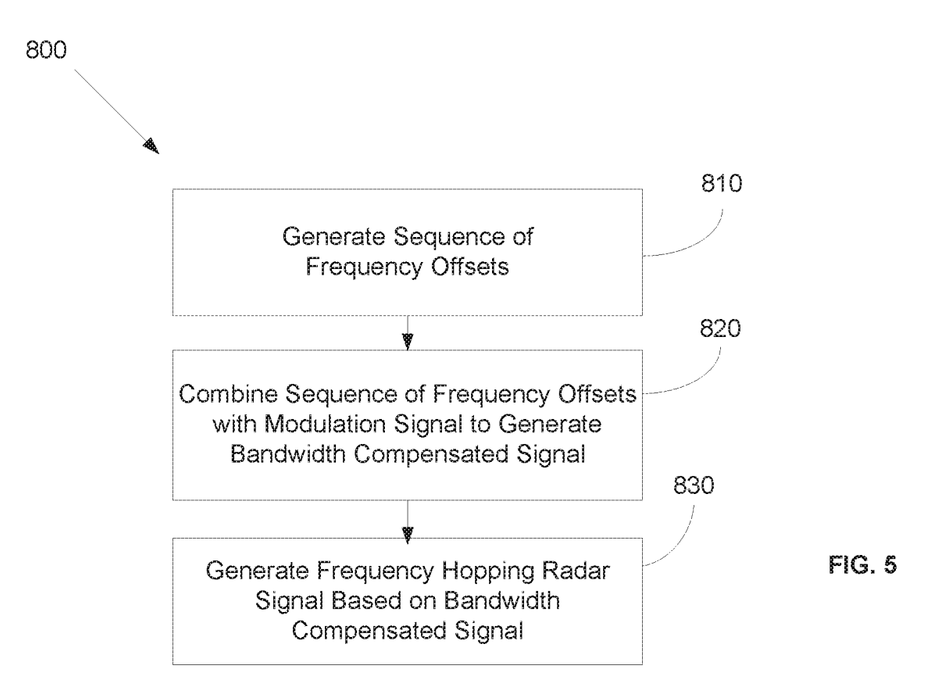
FIG. 5 illustrates an example method for generating a frequency hopping radar signal in accordance with various aspects described.

FIG. 5 illustrates an example method 800 for generating a frequency hopping radar signal. The method 800 may be performed, for example, by any of the radar signal modulators of FIGS. 2-4A. The method includes, at 810, generating a sequence of frequency offsets. The operation(s) outlined in 810 may be performed by the offset frequency generator of FIGS. 2-4A. The method includes, at 820, combining the sequence of frequency offsets with the modulation signal to generate a bandwidth compensated signal. The operation(s) outlined in 820 may be performed by the bandwidth compensation circuitry of FIGS. 2-4A. In one example, the bandwidth compensated signal has a higher bandwidth than a bandwidth of a PLL into which the bandwidth compensated signal is injected. The method includes, at 830, generating the frequency hopping radar signal based on the bandwidth compensated signal. The operation(s) outlined in 830 may be performed, for example, by the PLLs of FIGS. 2-4A.

It can be seen from the foregoing description that the described systems, circuitries, and methods generate random frequency hopping radar signals for use in object detection without the need for complex circuitry or software solutions.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, circuitries, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for generating a frequency hopping radar signal according to embodiments and examples described herein.

Example 1 is a radar signal modulator, including a frequency offset generator configured to generate a sequence of frequency offsets; a phase locked loop (PLL); and a bandwidth compensation circuitry to combine a modulation signal and the sequence of frequency offsets to generate a bandwidth compensated signal. The PLL is configured to receive the bandwidth compensated signal and generate a frequency hopping radar signal based on the bandwidth compensated signal.

Example 2 includes the subject matter of example 1, including or omitting optional elements, wherein the frequency offset generator is configured to generate a sequence of random frequency offsets.

Example 3 includes the subject matter of example 1, including or omitting optional elements, wherein the frequency offset generator is configured to generate a sequence of frequency offsets that encode frequency shift keying (FSK) or phase shift keying (PSK) information.

Example 4 includes the subject matter of example 1, including or omitting optional elements, wherein the bandwidth compensation circuitry includes low-pass injection circuitry and high-pass injection circuitry. The low-pass injection circuitry is configured to receive the modulation signal; receive the sequence of frequency offsets; and generate at least one low-pass injection signal based on the sequence of frequency offsets and the modulation signal. The high-pass injection circuitry is configured to receive the modulation signal; receive the sequence of frequency offsets; and generate at least one high-pass injection signal based on the sequence of frequency offsets and the modulation signal, such that the bandwidth compensated signal includes the low-pass injection signal and the high-pass injection signal. The PLL is configured to receive the at least one low-pass injection signal at a low-pass injection point; receive the at least one high-pass injection signal at a high-pass injection point; and generate the frequency hopping radar signal based on the at least one low-pass injection signal and the at least one high-pass injection signal.

Example 5 includes the subject matter of example 4, including or omitting optional elements, wherein the high-pass injection circuitry includes gain estimation circuitry configured to determine a gain for the at least one high-pass injection signal based on a sensed phase error of the phase locked loop; first combination circuitry configured to combine the modulation signal with the sequence of frequency offsets to generate a frequency hopping modulation signal; and a multiplier configured to scale the frequency hopping modulation signal based on the gain to generate the at least one high-pass injection signal.

Example 6 includes the subject matter of example 5, including or omitting optional elements, wherein the low-pass injection circuitry includes second combination circuitry configured to combine the modulation signal with the sequence of frequency offsets and a frequency command word for the phase locked loop to generate an adjusted frequency command word and a polarity of at least one of the modulation signal or the sequence of frequency offsets input to the first combination circuitry is reversed with respect to the respective modulation signal or the respective sequence of frequency offsets input to the second combination circuitry.

Example 7 includes the subject matter of example 4, including or omitting optional elements, wherein the high-pass injection circuitry includes modulation path gain estimation circuitry configured to determine a first gain for the modulation signal based on a sensed phase error of the phase locked loop; a first multiplier configured to scale the modulation signal based on the first gain to generate a first high-pass injection signal and provide the first high-pass injection signal to a first high-pass injection point; offset path gain estimation circuitry configured to determine a second gain for the sequence of frequency offsets based on the sensed phase error of the phase locked loop; and a second multiplier configured to scale the sequence of frequency offsets based on the second gain to generate a second high-pass injection signal and provide the second high-pass injection signal to a second high-pass injection point.

Example 8 includes the subject matter of example 7, including or omitting optional elements, wherein the first high-pass injection point is coupled to a first capacitor bank in an oscillator circuit of the phase locked loop and the second high-pass injection point is coupled to a second capacitor bank in the oscillator circuit.

Example 9 includes the subject matter of example 4, including or omitting optional elements, wherein the high-pass injection circuitry includes pre-distortion circuitry configured to determine a first gain for the modulation signal and a second gain for the sequence of frequency offsets that minimizes a phase error of the phase locked loop; a first multiplier configured to scale the modulation signal based on the first gain to generate a first high-pass injection signal and provide the first high-pass injection signal to a first high-pass injection point; and second multiplier configured to scale the sequence of frequency offsets based on the second gain to generate a second high-pass injection signal and provide the second high-pass injection signal to a second high-pass injection point.

Example 10 includes the subject matter of example 9, including or omitting optional elements, wherein the first high-pass injection point is coupled to a first capacitor bank in an oscillator circuit of the phase locked loop and the second high-pass injection point is coupled to a second capacitor bank in the oscillator circuit.

Example 11 includes the subject matter of example 4, including or omitting optional elements, wherein the low-pass injection circuitry includes second combination circuitry configured to combine the modulation signal with the sequence of frequency offsets and a frequency command word for the phase locked loop to generate an adjusted frequency command word and provide the adjusted frequency command word to divider circuitry in the phase locked loop.

Example 12 includes the subject matter of example 1, including or omitting optional elements, wherein the bandwidth compensation circuitry includes combination circuitry configured to combine the modulation signal with the sequence of frequency offsets and a frequency command word for the phase locked loop to generate an adjusted frequency command word and a pre-emphasis filter that filters the adjusted frequency command word to generate the bandwidth compensated signal.

Example 13 includes the subject matter of example 12, including or omitting optional elements, wherein the bandwidth compensation circuitry includes bandwidth estimation circuitry configured to estimate a bandwidth of the modulation signal; and control the pre-emphasis filter based on the estimated bandwidth.

Example 14 is a method for generating a frequency hopping radar signal, including generating a sequence of frequency offsets; combining the sequence of frequency offsets with a modulation signal to generate a bandwidth compensated signal; and providing the bandwidth compensated signal to a phase locked loop (PLL) to cause the PLL to generate the frequency hopping radar signal.

Example 15 includes the subject matter of example 14, including or omitting optional elements, including generating the sequence of frequency offsets based on random numbers.

Example 16 includes the subject matter of example 14, including or omitting optional elements, including generating the sequence of frequency offsets based on frequency key shifting (FSK) or phase shift keying (PSK) information.

Example 17 includes the subject matter of example 14, including or omitting optional elements, wherein a bandwidth of the bandwidth compensated signal is greater than a bandwidth of the PLL.

Example 18 includes the subject matter of example 14, including or omitting optional elements, including generating the bandwidth compensated signal by: generating at least one low-pass injection signal by combining the modulation signal with the sequence of frequency offsets and a frequency command word for the phase locked loop; generating at least one high-pass injection signal based on the modulation signal and the sequence of frequency offsets; determining a gain for the at least one high-pass injection signal based on a sensed phase error of the phase locked loop; and scaling the high-pass injection signal based on the gain. The bandwidth compensated signal is provided to the PLL by providing the at least one low-pass injection signal to a low-pass injection point of a phase locked loop and providing the scaled high-pass injection signal to a high-pass injection point of a phase locked loop.

Example 19 includes the subject matter of example 14, including or omitting optional elements, including generating the bandwidth compensated signal by combining the modulation signal with the sequence of frequency offsets and a frequency command word (FCW) for the phase locked loop to generate an adjusted FCW and filtering the adjusted FCW to generate the bandwidth compensated signal.

Example 20 includes the subject matter of example 19, including or omitting optional elements, further including determining an estimated bandwidth of the modulation signal based on a sensed phase error of the PLL and filtering the adjusted FCW based on the estimated bandwidth of the modulation signal.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

Various illustrative logics, logical blocks, modules, circuitries, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include field gates, logical components, hardware encoded logic, register transfer logic, one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

What is claimed is:

1. A radar signal modulator, comprising:
   a frequency offset generator configured to generate a sequence of frequency offsets;
   a phase locked loop (PLL); and
   a bandwidth compensation circuitry, comprising
      combination circuitry configured to combine a modulation signal with the sequence of frequency offsets and a frequency command word for the PLL to generate an adjusted frequency command word; and
      a pre-emphasis filter that filters the adjusted frequency command word to generate a bandwidth compensated signal,
   wherein the PLL is configured to receive the bandwidth compensated signal and generate a frequency hopping radar signal based on the bandwidth compensated signal.

2. The radar signal modulator of claim 1, wherein the frequency offset generator is configured to generate a sequence of random frequency offsets.

3. The radar signal modulator of claim 1, wherein the frequency offset generator is configured to generate a sequence of frequency offsets that encode frequency shift keying (FSK) or phase shift keying (PSK) information.

4. A radar signal modulator, comprising:
   a frequency offset generator configured to generate a sequence of frequency offsets;
   a phase locked loop (PLL); and
   a bandwidth compensation circuitry, comprising low-pass injection circuitry configured to:
      receive a modulation signal;
      receive the sequence of frequency offsets; and
      generate at least one low-pass injection signal based on the sequence of frequency offsets and the modulation signal; and
   high-pass injection circuitry configured to:
      receive the modulation signal;
      receive the sequence of frequency offsets; and
      generate at least one high-pass injection signal based on the sequence of frequency offsets and the modulation signal,
   wherein the PLL is configured to:
      receive the at least one low-pass injection signal at a low-pass injection point;
      receive the at least one high-pass injection signal at a high-pass injection point; and generate a frequency hopping radar signal based on the at least one low-pass injection signal and the at least one high-pass injection signal.

5. The radar signal modulator of claim 4, wherein the high-pass injection circuitry comprises:
gain estimation circuitry configured to determine a gain for the at least one high-pass injection signal based on a sensed phase error of the phase locked loop;
first combination circuitry configured to combine the modulation signal with the sequence of frequency offsets to generate a frequency hopping modulation signal; and
a multiplier configured to scale the frequency hopping modulation signal based on the gain to generate the at least one high-pass injection signal.

6. The radar signal modulator of claim 5, wherein:
the low-pass injection circuitry comprises second combination circuitry configured to combine the modulation signal with the sequence of frequency offsets and a frequency command word for the phase locked loop to generate an adjusted frequency command word; and
a polarity of at least one of the modulation signal or the sequence of frequency offsets input to the first combination circuitry is reversed with respect to the respective modulation signal or the respective sequence of frequency offsets input to the second combination circuitry.

7. The radar signal modulator of claim 4, wherein the high-pass injection circuitry comprises:
modulation path gain estimation circuitry configured to determine a first gain for the modulation signal based on a sensed phase error of the phase locked loop;
a first multiplier configured to scale the modulation signal based on the first gain to generate a first high-pass injection signal and provide the first high-pass injection signal to a first high-pass injection point;
offset path gain estimation circuitry configured to determine a second gain for the sequence of frequency offsets based on the sensed phase error of the phase locked loop; and
a second multiplier configured to scale the sequence of frequency offsets based on the second gain to generate a second high-pass injection signal and provide the second high-pass injection signal to a second high-pass injection point.

8. The radar signal modulator of claim 7, wherein the first high-pass injection point is coupled to a first capacitor bank in an oscillator circuit of the phase locked loop and the second high-pass injection point is coupled to a second capacitor bank in the oscillator circuit.

9. The radar signal modulator of claim 4, wherein the high-pass injection circuitry comprises:
pre-distortion circuitry configured to determine a first gain for the modulation signal and a second gain for the sequence of frequency offsets that minimizes a phase error of the phase locked loop;
a first multiplier configured to scale the modulation signal based on the first gain to generate a first high-pass injection signal and provide the first high-pass injection signal to a first high-pass injection point; and
second multiplier configured to scale the sequence of frequency offsets based on the second gain to generate a second high-pass injection signal and provide the second high-pass injection signal to a second high-pass injection point.

10. The radar signal modulator of claim 9, wherein the first high-pass injection point is coupled to a first capacitor bank in an oscillator circuit of the phase locked loop and the second high-pass injection point is coupled to a second capacitor bank in the oscillator circuit.

11. The radar signal modulator of claim 4, wherein the low-pass injection circuitry comprises second combination circuitry configured to:
combine the modulation signal with the sequence of frequency offsets and a frequency command word for the phase locked loop to generate an adjusted frequency command word; and
provide the adjusted frequency command word to divider circuitry in the phase locked loop.

12. The radar signal modulator of claim 1, wherein the bandwidth compensation circuitry comprises bandwidth estimation circuitry configured to:
estimate a bandwidth of the modulation signal; and
control the pre-emphasis filter based on the estimated bandwidth.

13. A method, comprising:
generating a sequence of frequency offsets;
generating at least one low-pass injection signal by combining a modulation signal with a sequence of frequency offsets and a frequency command word for a phase locked loop (PLL);
generating at least one high-pass injection signal based on the modulation signal and the sequence of frequency offsets;
providing the at least one low-pass injection signal to a low-pass injection point of the PLL; and
providing the high-pass injection signal to a high-pass injection point of the PLL to cause the PLL to generate a frequency hopping radar signal;
transmitting the frequency hopping radar signal; and
processing received signals corresponding to reflections of the frequency hopping radar signal to detect objects.

14. The method of claim 13, comprising generating the sequence of frequency offsets based on random numbers.

15. The method of claim 13, comprising generating sequence of frequency offsets based on frequency key shifting (FSK) or phase shift keying (PSK) information.

16. The method of claim 13, wherein
the low-pass injection signal and the high-pass injection signal together comprise a bandwidth compensated signal, and
a bandwidth of the bandwidth compensated signal is greater than a bandwidth of the PLL.

17. The method of claim 13, comprising:
determining a gain for the at least one high-pass injection signal based on a sensed phase error of the phase locked loop; and
scaling the high-pass injection signal based on the gain; and
providing the scaled high-pass injection signal to the high-pass injection point of a phase locked loop.

18. The method of claim 13, comprising generating the low-pass injection signal by:
combining the modulation signal with the sequence of frequency offsets and a frequency command word (FCW) for the PLL to generate an adjusted FCW; and
filtering the adjusted FCW to generate the low-pass infection signal.

19. The method of claim 18, further comprising determining an estimated bandwidth of the modulation signal based on a sensed phase error of the PLL and filtering the adjusted FCW based on the estimated bandwidth of the modulation signal.

* * * * *